April 23, 1957 L. S. PELFREY 2,790,089

THREE-ELEMENT SEMI-CONDUCTOR DEVICE

Filed March 23, 1953

LOWELL S. PELFREY
INVENTOR.

BY [signature]

ATTORNEYS

United States Patent Office 2,790,089

Patented Apr. 23, 1957

2,790,089

THREE-ELEMENT SEMI-CONDUCTOR DEVICE

Lowell S. Pelfrey, Manhattan Beach, Calif., assignor, by mesne assignments, to National Aircraft Corporation, Burbank, Calif., a corporation of California Application March 23, 1953, Serial No. 344,030

7 Claims. (Cl. 250—217)

This invention relates generally to semi-conductor devices, and particularly to a three-element semi-conductor device utilizing light generated by gaseous conduction between two of the elements to modulate the flow of current in the third element.

In 1948 J. Bardeen and W. H. Brattain of The Bell Telephone Laboratories announced the development of the transistor, a three-element semi-conductor device adapted for use as an amplifier, oscillator, etc. This device as presently developed has many substantial advantages including small size and weight, instant availability for use, and freedom from cathode heating requirements. However, the conventional transistor is also subject to certain limitations in that it is characterized by a low input impedance and relatively high transit time. The low input impedance of the conventional transistor has made necessary the use of transformers, cathode followers, and other impedance matching devices which greatly increase the size and expense of transistor circuits. The objectionable transit time effects, resulting from the fact that the holes and electrons move within the semi-conductor material at a relatively slow rate, severely limits the frequency range in which the transistor may be satisfactorily employed. This is particularly true in transistor amplifier circuits since the amplification factor of the transistor falls off very substantially when the higher frequencies are reached.

In view of the above problems characterizing the field of transistors, it is an object of the present invention to provide a three-element semi-conductor device, in the nature of a transistor, having a relatively high input impedance and low transit time.

Another object of the invention is to provide a device utilizing gaseous conduction between the emitter and semi-conductor to generate light adapted to modulate the flow of current between the semi-conductor and collector, so that the transit time is dependent upon the speed of light as distinguished from the velocities at which the electrons and holes move within the semiconductor.

These and other objects and advantages of the invention will be more fully appreciated upon a reading of the following specification and claims considered in connection with the attached drawing to which they relate.

Figure 1:
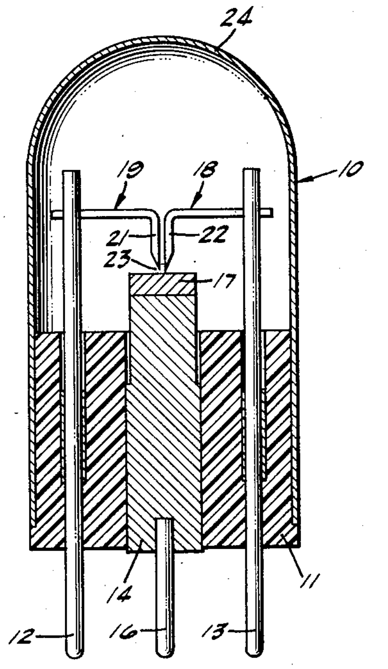
Figure 1 is a vertical sectional view of a three-element semiconductor similar to a point-contact transistor.
Figure 2:
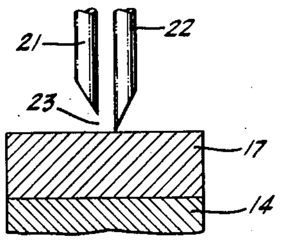
Figure 2 is an enlarged detail view of the region between the emitter, collector, and semi-conductor of the device of Figure 1.

Referring to Figures 1 and 2 of the drawing, the three-element semi-conductor device, denoted generally by the reference character 10, is shown to comprise a supporting cylinder 11 formed of suitable insulating material such as polystyrene, a pair of support rods 12 and 13 extending vertically through diametrically opposed portions of cylinder 11, and a relatively large diameter base cylinder 14 mounted axially of support cylinder 11 between rods 12 and 13. Inserted in the lower end of base cylinder 14 is a short rod 16 corresponding to rods 12 and 13 and providing electrical connection to a socket or the like, it being understood that the rods 12, 13, and 16, and base cylinder 14, are formed of suitable electrically conductive material.

As in the case of conventional transistors, a suitable semi-conductor 17, for example in block form, is secured on the upper end of base cylinder 14, the nature of the connection being such that a low resistance electrical contact is provided. Block 17 may, for example, consist of a crystal of germanium, selenium, tellurium, boron, or silicon, containing a sufficient number of impurity centers to provide hole or electron conduction of the usual type. Preferably, semi-conductor 17 consists of negative or N-type germanium. A small diameter electrode wire 18 is soldered or otherwise secured transversely of the upper end of support rod 13 and bent vertically downwardly so that its pointed lower end is in engagement with the upper surface of semi-conductor 17 as is conventional in point-contact transistors. The high resistance point contact between electrode 18, which is normally termed the collector, and semi-conductor 17 is electrically "formed" during manufacture in such a manner that the N-type germanium of semi-conductor 17 is converted to positive or P-type germanium in a small surrounding region. An electrode 19, known as the emitter, is soldered to the upper end of rod 12 and preferably corresponds in shape and size to the collector 18, there being a downwardly extending portion 21 of emitter 19 disposed parallel and adjacent to the corresponding portion 22 of collector 18.

In conventional transistors, the lower pointed end of emitter 19 is in point contact with semi-conductor 17, and currents are caused to flow from the emitter through the point contact to germanium crystal 17, thence through the germanium to collector 18. According to the present invention, the lower end of the emitter 19 is not in contact with crystal 17 but instead is spaced a slight distance above it as shown at 23. The invention further comprises filling the space 23 with an electrically conductive inert gas, so that gaseous conduction and consequent light generation occur during flow of current from emitter 19 to germanium 17. In the illustrated construction, the gas is contained in an envelope or dome 24 force fitted downwardly over supporting cylinder 11. The chamber within envelope 24 is first evacuated and then filled with a suitable inert gas, for example argon, neon, mercury vapor, or xenon. Xenon has been found to be preferable since the conduction of electricity through this gas results in the creation of a relatively large proportion of infra-red rays, to which the germanium 17 reacts to a high degree as compared to light of the shorter wave lengths.

The size of the space 23 between emitter portion 21 and the semi-conductor 17, and also the amount of spacing between portion 21 and the corresponding portion 22 of collector 18, is governed by several factors. In the first place, the space 23 must be of sufficient length to insure that the emitter may never contact semi-conductor 17 regardless of any shocks or stresses to which the device may be subjected. In the second place, the lower tip of emitter portion 21 should be sufficiently close to the point contact between the collector and semi-conductor to provide an efficient bombardment of the point contact with light generated during the gaseous conduction. It has been found that a preferred length of space 23 is .001 inch, with the spacing between the tip of emitter portion 21 and the point contact being only slightly greater. The latter is accomplished by similarly spacing portions 21 and 22 approximately .001 inch apart.

In the operation of the embodiment of Figures 1 and 2, a suitable bias is applied to each of the rods 12, 16, and 13 leading to the emitter 19, collector 18, and base 14. The bias of emitter 19 will normally be positive and that of collector 18 negative relative to base 14, the amount of the bias being sufficient to induce conduction through the gas from the emitter to the semi-conductor. The gaseous conduction results in the generation of light or radiant energy in the broader sense, including both visible and invisible portions of the spectrum. As the light impinges on the surface of the semi-conductor, electrons will be ejected and holes created as in the case of conventional transistors, and the holes modulate the collector current in the same manner as a signal impressed on the device between the emitter and base. Where the device is employed as an amplifier, useful gain results since each increment of collector current exceeds the corresponding increment of emitter current.

It is a principal feature of the invention that the light travels at a very high velocity, 186,300 miles per second, to the region immediately adjacent the point contact between the collector and germanium. This is to be distinguished from the relatively slow movements of electrons and holes in conventional transistors, from a point contact between the emitter and germanium to the collector-germanium point contact, so that the transit time of the present device is relatively very low. It is a further feature of the invention that the input impedance of the device, between emitter 19 and base 14, is very high due to the fact that the gaseous path between the emitter and germanium has a much greater impedance than that of a point contact. Because of these two decided advantages over prior devices, the present invention may be successfully employed at very high frequencies and without the use of cathode followers, transformers, etc.

Figure 4:
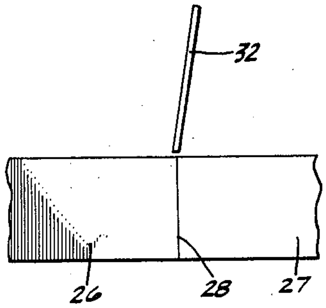
Figure 4 is an enlarged detail view of the junction region of Figure 3.
Figure 3:
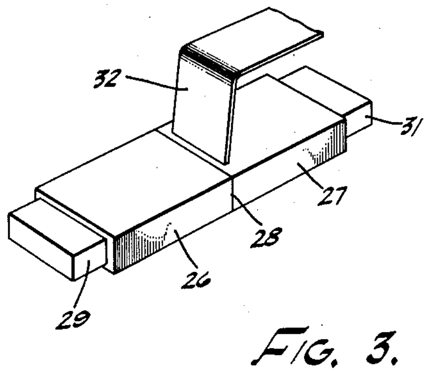
Figure 3 is a perspective view of a three-element semiconductor device similar to a junction transistor, the gas envelope being unshown.

Referring to Figures 3 and 4, the application of the invention to a junction transistor is illustrated. In this embodiment, a bar or block 26 of N-type semi-conductor is associated with a bar 27 of P-type semi-conductor along a plane of junction 28. The semi-conductor portions 26 and 27 are electrically contacted, respectively, by large area low resistance contact blocks 29 and 31. An emitter 32, which preferably comprises a metallic strip of a width slightly less than that of junction 28, is provided in substantially the same plane as the junction but is spaced a slight distance above the upper junction edge. As in the previous embodiment of the invention, the spacing between the parallel edges of emitter 32 and junction 28 is barely sufficient to insure that actual contact between these elements will never occur, and is preferably on the order of .001 inch. An envelope, not shown, surrounding the elements 26, 27, and 32 is evacuated and then filled with an electrically conductive inert gas, so that gaseous conduction results as in the case of the previous embodiments.

In the operation of the embodiment of Figures 3 and 4, N-type semi-conductor 26 is preferably biased negatively, and emitter 32 positively relative to P-type semi-conductor 27. These biases are sufficient to cause gaseous conduction between the lower edge of emitter element 32 and the parallel edge of junction 28, resulting in the bombardment of the junction region with light. The amount of current flow at the junction is thus varied, so that the device may be employed as an amplifier, switching device, etc.

While the particular device herein shown and described in detail is fully capable of attaining the objects and providing the advantages hereinbefore stated, it is to be understood that it is merely illustrative of the presently preferred embodiments of the invention and that no limitations are intended to the details of construction or design herein shown other than as defined in the appended claims.

I claim:

1. A three-element semi-conductor device, comprising a block of semi-conductor material, a first electrode in low resistance contact with said semi-conductor, a second electrode in high resistance point-contact with said semi-conductor, a third electrode spaced a slight distance from said semi-conductor adjacent the point-contact between said second electrode and semi-conductor, an envelope surrounding said semi-conductor and said second and third electrodes, and an inert gas provided in said envelope, said device functioning during conduction through said gas between said third electrode and semi-conductor to bombard with light the region of said semi-conductor surrounding said point-contact.

2. The invention as claimed in claim 1, wherein the spacing between said third electrode and semi-conductor is approximately .001 inch.

3. The invention as claimed in claim 2, wherein the spacing between said second and third electrodes at the portions thereof adjacent said semi-conductor is approximately .001 inch.

4. A three-element semi-conductor device, comprising a base electrode, a block of N-type germanium mounted in low resistance contact with said base electrode, a small diameter collector wire mounted in high resistance point-contact with said germanium, said point-contact being formed to convert a small surrounding region to P-type germanium, a small diameter emitter wire extending toward said germanium to a point spaced a slight distance from said germanium and from said point-contact, an envelope surrounding said emitter, collector, and germanium block, and an inert electrically conductive gas provided in said envelope.

5. In a three-element semi-conductor device, a P–N junction region in a mass of semi-conductor, an electrode spaced a slight distance from said junction region and from said mass of semi-conductor, and an inert gas provided in the space between said electrode and junction region, whereby said junction region is bombarded with light during gaseous conduction between said electrode and junction region.

6. In a three-element semi-conductor device, a block of P-type semi-conductor, a block of N-type semi-conductor, a plane of junction separating said N-type block from said P-type block, an emitter electrode extending toward one edge of said plane of junction and terminating a slight distance therefrom and from said blocks, a pair of electrodes in low resistance contact, respectively, with said N-type and P-type blocks, means to define a gas-tight chamber including adjacent portions of said emitter electrode and said one junction edge, and an electrically conductive inert gas provided in said chamber to conduct current between said emitter electrode and junction.

7. The invention as claimed in claim 6, wherein said emitter electrode is a strip mounted in substantially the same plane as said junction, said strip terminating in a transverse edge parallel to said one junction edge and spaced approximately .001 inch therefrom.

References Cited in the file of this patent

UNITED STATES PATENTS 2,592,683 Gray ---------------- Apr. 15, 1952